United States Patent [19]

Puckette, IV

[11] Patent Number: 4,902,979
[45] Date of Patent: Feb. 20, 1990

[54] HOMODYNE DOWN-CONVERTER WITH DIGITAL HILBERT TRANSFORM FILTERING

[75] Inventor: Charles M. Puckette, IV, Scotia, N.Y.

[73] Assignee: General Electric Company, Schenectady, N.Y.

[21] Appl. No.: 321,697

[22] Filed: Mar. 10, 1989

[51] Int. Cl.⁴ .............................................. H03D 3/00
[52] U.S. Cl. .................................... 329/343; 375/102; 455/311
[58] Field of Search ................ 324/110, 124, 136, 139, 324/145,-207; 375/78, 80, 102; 455/214, 296, 303, 304, 305, 310, 311, 317

[56] References Cited

U.S. PATENT DOCUMENTS

| | | | |
|---|---|---|---|
| 4,647,864 | 3/1987 | Rafferty et al. | 329/110 X |
| 4,755,761 | 7/1988 | Ray, Jr. | 329/124 X |
| 4,814,715 | 3/1989 | Kasperkovitz | 329/124 X |

OTHER PUBLICATIONS

"Discrete Hilbert Transform Filters", R. L. Lavallee, M.S. Thesis, Syracuse University, 1971.

Primary Examiner—Eugene R. LaRoche
Assistant Examiner—Robert J. Pascal
Attorney, Agent, or Firm—Geoffrey H. Krauss; James C. Davis, Jr.; Marvin Snyder

[57] ABSTRACT

A homodyne down-converter, for use in an IF signal demodulator and the like, includes an analog-to-digital converter (ADC) which receives the IF analog signal for conversion to a digital data stream by sampling at a sampling rate frequency substantially equal to four times the IF signal frequency. A digital mixer controllably inverts the sampled data to convert the data to baseband, before a circuit removes the effects of DC offset in the analog IF signal applied to the ADC. A discrete Hilbert Transform filter is used for generating streams of sequential in-phase I' and quadrature-phase Q' data words, which are resampled to temporally align the two data word streams at a new data rate, thus effectively removing sample offset without the need for separate misalignment correction circuitry.

10 Claims, 3 Drawing Sheets

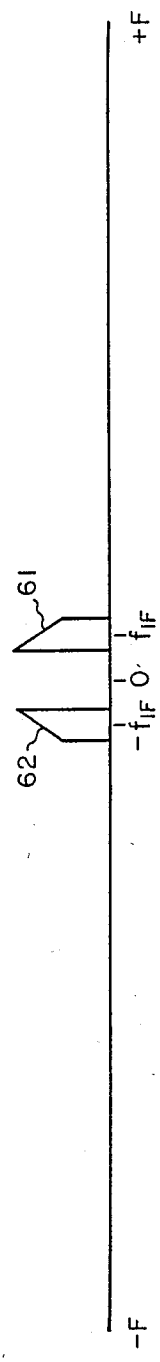
Fig. 2a
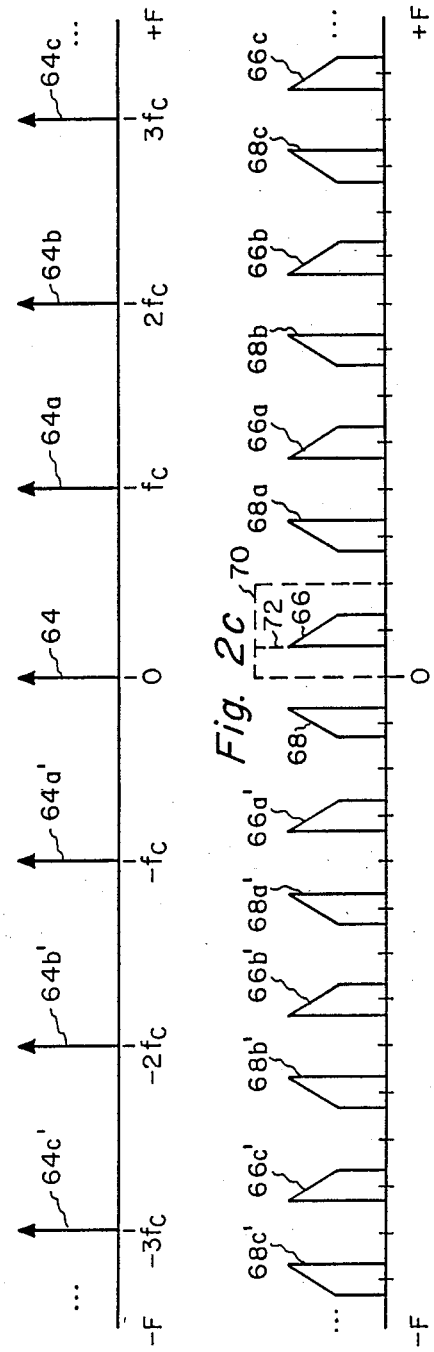
Fig. 2b
Fig. 2c

HOMODYNE DOWN-CONVERTER WITH DIGITAL HILBERT TRANSFORM FILTERING

The present invention relates to apparatus for recovering the modulating signal from a modulated RF carrier signal and, more particularly, to a homodyne down-converter for converting an intermediate-frequency (IF) signal to baseband for subsequent demodulation, and with separation into quadrative components by digital Hilbert transform filtering to substantially reduce effects of input signal DC bias and/or sampling time misalignment.

A superheterodyne form of receiver, in which the received carrier signal is frequency converted to an intermediate frequency (IF) at which filtering and modulation detection are accomplished, is well known. It is highly desirable to provide the modulation detection portion of such a receiver in monolithic integrated circuit form.

PRIOR ART

One integratable demodulator is the homodyne, or zero IF, FM demodulator described and claimed in U.S. Pat. No. 4,755,761, issued July 5, 1988, assigned to the assignee of the present invention and incorporated herein in its entirety by reference. In that patent, a zero-IF baseband demodulator receives a down-converted IF signal for application to a first input of each of first and second RF mixer means. A locally-generated LO signal at the carrier frequency is applied directly to a second input of one of the mixer means, and is phase-shifted by 90°, in a quadrature shift means, to provide a quadrature LO signal which is applied to a second input of the other mixer means. The baseband signals at the mixer outputs are respectively an in-phase signal and a quadrature-phase signal. After suitable lowpass filtering in an associated filter means, a baseband in-phase I signal is provided at an intermediate node while a baseband quadrature-phase Q signal is provided at another intermediate node; the portion of the demodulator prior to the intermediate nodes can be denoted as a converter, and the portion after the nodes can be denoted as a discriminator.

This form of down-converter uses a number of analog blocks; it is highly desirable to utilize digital signal processing to reduce the size, power and unit cost and increase the reliability of each of these blocks, as well as to facilitate fabrication of a completely digital demodulator as part of a single integrated circuit chip. One promising digital demodulator is that of W. Rafferty et al., as described and claimed in U.S. Pat. No. 4,647,864, issued Mar. 3, 1987, assigned to the assignee fo the present invention and incorporated herein in its entirety by reference. This non-coherent digital demodulator of analog FM signals utilized an analog-to-digital converter for converting the analog FM signal at the IF frequency to a sampled stream of digital data words, which are applied to a digital mixer for sorting into separate I and Q data streams which comprise the baseband representation of the modulated waveform. The use of a converter outputting two baseband data streams is necessary in order to retain both the phase and frequency information contained in the IF signal. A subsequent digital non-coherent detector is used to extract the argument of a sine function which is proportional to the modulating signal. This function provides a demodulator digital data output, which can, if required, be converted back to an analog signal to provide a demodulator analog output. While substantially of digital nature, the entire converter-discriminator apparatus was found to produce a pair of undesired output side lobes whenever the sampling frequency was not exactly equal to four times the carrier frequency, and was also found to contain a second pair of undesired sidelobes, if the aforementioned frequency offset was present and there also was any DC content in the IF input signal. These two problems are associated with the converter portion of the apparatus. One manner in which these problems can be solved is described and claimed by G. J. Saulnier et al. in U.S. patent application Ser. No. 280,073, assigned to the assignee of the present application, filed Dec. 5, 1988, and incorporated herein by reference in its entirety. The down-converter in that application uses a relatively complex digital circuit; a simpler circuit is desirable.

BRIEF SUMMARY OF THE INVENTION

In accordance with the invention, a homodyne down-converter, for use in an IF demodulator and the like, includes: an analog-to-digital converter (ADC) means receiving the IF analog signal for conversion to a digital data stream by sampling at a sampling rate frequency substantially equal to four times the IF signal frequency; digital means for controllably inverting the sampled data to convert the data to baseband; means for removing the effects of DC offset in the analog IF signal applied to the ADC; a discrete Hilbert Transform filter means for generating streams of sequential in-phase I' and quadrature-phase Q' data words; and resampling means for temporally aligning the two data word streams at a new data rate, thus effectively removing sample offset without the need for separate misalignment correction circuitry.

In the present preferred embodiment, the DC offset removal means uses averaging of the baseband samples. The discrete Hilbert transform filter means uses one of a class of digital circuitry limiting transmission of negative IF frequency components, to generate an analytic signal for demodulation.

Accordingly, it is an object of the present invention to provide a novel homodyne down-converter, for use with a digital demodulator, which uses a digital Hilbert Transform Filter to substantially remove all effect of at least analog signal input sampling frequency error upon the recovered data.

BRIEF DESCRIPTION OF THE DRAWINGS

FIGS. 2a–2c are a set of frequency-domain graphs illustrating the filtering effect of the DHTF on a periodic sampled IF signal.

DETAILED DESCRIPTION OF THE PRESENTLY PREFERRED EMBODIMENT

Figure 1:
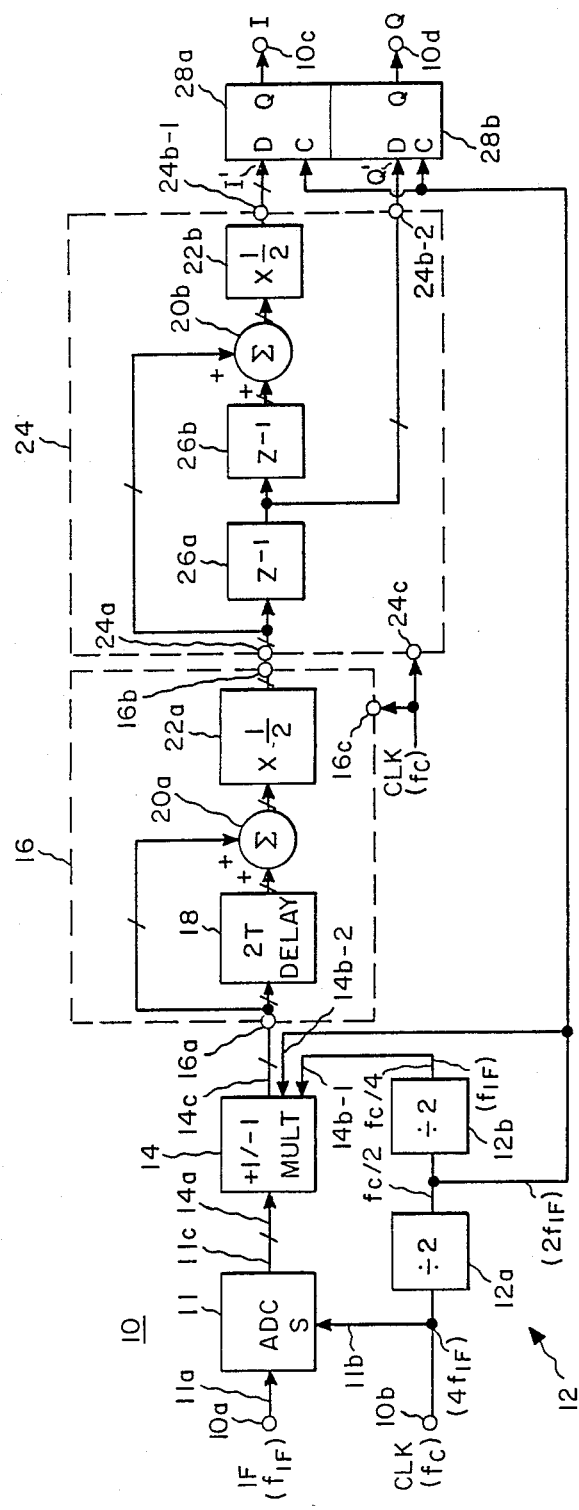
FIG. 1 is a schematic block diagram of a homodyne down-converter, in accordance with the principles of the present invention, for producing baseband I and Q signals substantially free of DC input bias and sampling frequency error effects.

Referring initially to FIG. 1, a presently preferred embodiment of a homodyne down-converter 10 is illustrated which receives an intermediate-frequency (IF) analog signal at a first input 10a and receives a clock CLK signal, at a frequency $f_c$ which is four times the IF frequency ($f_{IF}$), at a second input 10b, for producing streams of baseband in-phase I and quadrature-phase Q data words at respective down-converter outputs 10c and 10d. These output data words are to be provided in a sequential manner, free of both input DC bias and sampling frequency errors. The (frequency-modulated) analog IF signal at input 10a is applied to the analog input 11a of a single analog-to-digital converter (ADC) means 11, which receives the sampling clock signal at a sample S input 11b. A multiple-bit-wide digital data word is provided at an ADC means data output port 11c responsive to each of the substantially-equal-spaced sample pulse pulses; the data word then being output characterizes the amplitude of the input analog signal substantially at the instant the sample pulse is received at the sample input 11b.

A frequency division means 12 causes the clock signal frequency to be reduced by a factor of two in a first divide-by-two means 12a, to generate a first, or half-clock, signal at a frequency $2f_{IF}=(f_c/2)$; this frequency is also divided in half by a second divide-by-two means 12b, to generate another, or quarter-clock, signal at a frequency ($f_c/4$) equal to the center frequency ($f_{IF}$) of the analog input signal. A digital mixer means 14 performs the frequency translation of the IF sampled data (from the ADC means output dataport 11c) to baseband, responsive to the half-clock and quarter-clock signals. Thus, the stream of digital data words from ADC means 11 is provided to a first input 14a of means 14, which can also be called a $+1/-1$ multiplier means. The quarter-clock signal is received at a first clock input 14b-1, while the half-clock signal is received at a second clock input 14b-2. A stream of baseband digital data words, provided at the output 14c of the $+1/-1$ multiplication means, is applied to a data input 16a of a DC offset removal means 16, which can be considered as a high-pass filter with a DC zero. The offset removal means also receives the clock CLK signal, at frequency $f_c$, at a clock input 16c, and provides, at an output 16b, a stream of digital data words from which has been removed the effects of any DC bias on the analog input signal at input 10a.

The DC offset removal means 16 includes a delay means 18, for delaying each input data word by twice the time interval T of the clock waveform cycle. The delayed input data word is added to the data word then appearing at means input 16a, in a first summation means 20a. The resulting sum is applied to a first multiplication-by-one-half means 22a, which effectively divides the summed data by a factor of 2 (essentially a rightward shift of the entire data word by one data bit), to take the average of two successive data samples.

The single digital data stream, with interleaved in-phase and quadrature-phase data words, from which the effects of DC bias has been removed, is applied to the input 24a of a discrete Hilbert transform filter (DHTF) means 24, which also receives the clock CLK signal, at frequency $f_c$, at a clock input 24c. The DHTF means provides simultaneous in-phase and quadrature-phase digital data words at respective outputs 24b-1 and 24b-2, so that additional temporal misalignment correction is not necessary. The DHTF means 24 operates by generating an analytic signal (a complex function of a real variable, whose real and imaginary parts are Hilbert Transform pairs) which is limited to positive frequencies. Since a real signal can be represented as a real part of the complex envelope of an analytic signal, anti-aliasing can be directly accomplished in the DHTF means. The DHTF network of means 24 can be designed by first selecting the sampling rate of the clock CLK signal such that the negative frequency sidebands of sampled signal fall at $-j$ (i.e. that location with unit amplitude and negative imaginary phase) in the Z-plane, and the desired positive frequency sidebands fall at $+j$. The order n of the filter is selected and the filter is then synthesized to as to yield a n-th order zero at $-j$ and a n-th order pole at $Z=0$ (to provide realizability). Therefore, the desired Z-plane transfer function H(z) of DHTF means 24 is:

$$H(z)=(z+j)^n/z^n,$$

which is, for a second-order (n=2) filter:

$$H(z)=1+2jZ^{-1}-Z^{-2}$$

or, separating the real and imaginary parts, is $$H(z)=(1-Z^{-2})+j(2Z^{-1}).$$

It should be understood that DHTF networks for $n>2$ may provide a wider bandwidth than the illustrated n=2 filter means, and can be implemented in manner known to the art. For the illustrated n=2 DHTF means 24, the input data word is delayed for a first clock cycle in a first $Z^{-1}$ delay means 26a and is then delayed for a second clock cycle in a second $Z^{-1}$ delay means 26b. The twice-delayed data word and the undelayed data word are added in a second summer means 20b, and the sum of the data is then divided by a factor of 2 in another multiply-by-one-half means 22b, to provide the real, or in-phase, data I' word at output 24b-1. The imaginary, or quadrature-phase, data Q' word is provided directly to the output 24b-2 from the first delay stage 26a. Each of the in-phase and quadrature-phase data is resampled by an associated one of a pair of type-D flip-flop means 28a and 28b, each receiving, at the data D input thereof, the data from an associated one of outputs 24b-1 or 24b-2. The clock C inputs of both flip-flops receive, in common, the half-clock-frequency square-wave signal from the output of the first divide-by-two means 12a. The resampled in-phase data is provided at the true-Q output of first flip-flop means 28a, and thence to the in-phase I data output 10c of the down-converter, while the resampled quadrature-phase data is provided at the true-Q output of second flip-flop means 28b, and thence to the quadrature-phase Q data output 10d of the down-converter.

Figure 1A:
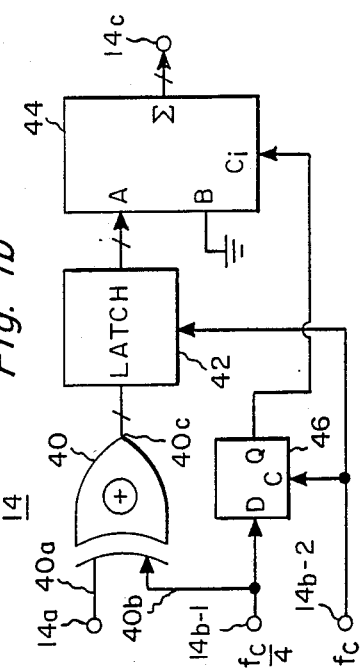
FIG. 1a is a graph illustrating an input analog signal wave and the nature of the complex digital sampling process, and useful in appreciating the problems alleviated by the present invention.

FIG. 1a illustrates the complex digital sampling process, wherein an analog signal waveform 30, occupying a time interval $\tau=1/f_{IF}$, is sampled four times during each cycle thereof. The first sample $S_1$ produces a sampled signal 32 of a first amplitude, which is converted to a data word to be assigned to the in-phase I data stream. The next sample $S_2$ occurs at a time $\tau/4$ after sample $S_1$, and produces a data sample 34 assigned to the quadrature-phase Q data stream. Thereafter, after another time interval $\tau/4$, a third sample $S_3$ is taken; this is another I sample 36. Because the sample data 36 of sample S₃ is now at a time interval τ/2 after the initial I sample S₁, it occurs during the opposite-polarity half-cycle from the S₁ sample and must involve an inversion of the I data; i.e. an inverted I, or Ī, sample. Similarly, the fourth sample S₄ is a next Q sample, provided at a time interval τ/2 after the initial Q sample, so that the fourth sample data 38 is an inverted Q, or Q̄, sample. Thereafter, the 4-sample-per-cycle process repeats, with a I data stream sample S₅, a Q data stream sample S₆, and so forth. It will be seen that the third and fourth samples in each cycle are properly assigned to the respective I and Q data streams, but require multiplication by a factor of −1; if the ADC means 11 output data is provided in two's-complement form, this multiplication is effectively implemented as a simple inversion of the two's-complement representation of the sample data. Therefore, the complex digital sampling process can be accomplished in three separate steps: (a) sampling of the input waveform at a sampling clock frequency $f_c$ which is four times its center, or carrier, frequency; (b) inversion of alternate pairs of the sampled signals; and (c) proper splitting of the stream of data samples into in-phase I and quadrature-phase Q components. These three process steps are carried out respectively in ADC means 11, digital mixer means 14 and as part of the operation of the DHTF means 24.

Figure 1B:
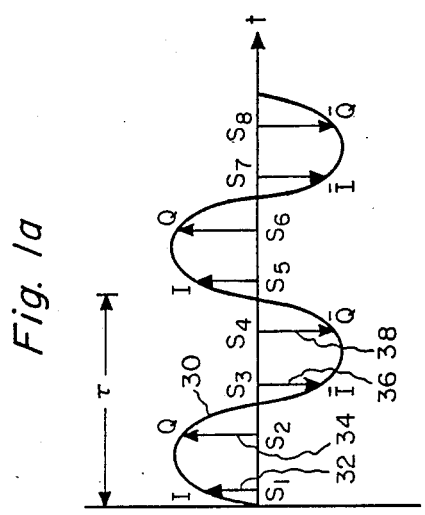
FIG. 1b is a schematic block diagram of a +1/−1 digital multiplier utilized in the present invention.

Referring now to FIG. 1b, the digital mixer means 14 must convert the sample data stream down to baseband. For an n=8 bit, two's complement data stream, this conversion is accomplished by a two's-complement inversion of every other pair of data words in the sample stream. The two's-complement inversion uses (a) inversion of each data bit of the input data (i.e. one's-complement inversion) and (b) the addition of a value 1 to the result of (a). Exclusive-OR gating, ideally with a center-frequency ($f_c/4$) signal which inherently inverts every other pair of sample data words, is illustratively used for the one's-complement inversion of part (a). Having to provide an approximation of the center frequency, the local signal is provided by dividing the sampling clock CLK signal by a factor of 4 (in means 12). The single data stream is therefore introduced at mixer means input 14a, and each of the m parallel data bits is provided to a first input 40a of an associated exclusive-OR gate 40, which also receives the center frequency square-wave signal at its remaining input 40b. The m=8 paralleled exclusive-OR gates (of which only one is shown, for clarity) do not affect the input data when the input 40b is at a low logic level, but perform a one's-complement inversion when the input 40b is at a high logic level. In order to correctly complete the inversion of the two's-complement data appearing at input 14a (from ADC means 11), the quantity one must be added to the result of the one's-complement inversion. The one's-complement-inversion data at gate output 40c is temporarily latched, in latch means 42, responsive to a selected edge of the sampling clock CLK signal from input 14b-2; each latched data bit is provided to a first A data input of the associated one of n stages of an adder means 44. Each adder means 44 stage receive a low logic level at a second B data input. The necessary addition of a quantity one occurs as the least-significant-bit stage receives at its carry-in $C_i$ input a positive (logic 1) signal from a true-Q output of a type-D flip-flop means 46, which is responsive to the sampling clock CLK signal at input 14b-2 and to the quarter-clock signal at input 14b-1. It will be seen that (because the gates simple pass the data at input 40a in unchanged manner when the XOR gate input 40b is at a logic low level) the presence of a low logic level at the same time at the adder means 44 carry-in $C_i$ input will leave the data unchanged, so that a proper two's-complement inversion of alternate pairs of data samples is carried out, as required for the digital mixing step (b).

Figure 1C:
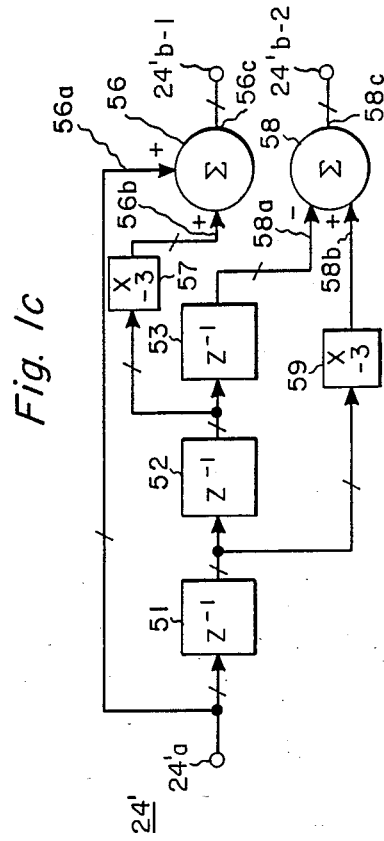
FIG. 1c is a schematic block diagram of one type of digital Hilbert Transform Filter (DHTF) for use in the present invention.

FIG. 1c illustrates an alternative, n=3-order DHTF filter means 24', characterized by a Z-plane transfer function $$H(z)=(z+j)^3/z^3$$

or $$H(z)=(1-3z^{-2})+j(3z^{-1}-z^{-3}).$$

Thus, the third-order DHTF filter means 24' utilizes three sequential one-clock-interval delay $Z^{-1}$ means 51, 52 and 53, and a pair of digital summation means 56 and 58, to provide the real data signal at output 24'b-1 and the imaginary part data at output 24'b-2. Specifically, the input data (or data input 24'a) is provided directly to a first input 56a of the first summer means, while the twice-delayed data at the output of delay means 52 is multiplied by a factor of (−3) in means 57 and provided at the second input 56b of the first summer means; the real part of the output data is the input data multiplied by $(1-3Z^{-2})$, as required by the foregoing filter transfer equation. Similarly, the thrice-delayed data from delay means 53 is effectively. multiplied by −1 by being applied to a subtractive (−1) first input 58a of the second summer means, while the once-delayed data, from the output of first delay means 51, is multiplied by a factor of (+3) in means 59 and provided to the second input 58b of that summer means, so that the imaginary part of the data is the input data multiplied by $(3Z^{-1}-Z^{-3})$, as also required by the transfer function. It should be understood that other zero patterns can be used to implement the DHTF means, e.g., staggered patterns; patterns established using the Parks McClellan Algorithm (equal ripple phase error), and the like.

Referring now to FIGS. 2a through 2c, the generation of the analytical signal using a discrete Hilbert transform filter is accomplished by acting upon a bandpass signal having a positive frequency domain 61 and a negative frequency domain 62 (FIG. 2a), by sampling at a rate which satisfies the bandpass signal sampling theorem. The sampling signal (FIG. 2b) appears to be a succession of unit sampling impulse functions having a DC component 64, positive frequency components 64a, 64b, 64c, . . . (at positive integer multiples of the sampling clock frequency $f_c$) and negative frequency components 64a', 64b', 64c', . . . (at negative integer multiples of the sampling clock frequency). The sampled bandpass signal is thus replicated about each of the sampling clock frequency impulses, with the positive bandpass frequency spectrum 66 appearing about the DC frequency (FIG. 2c). Passing the total signal through a DHT filter network will ideally multiply the spectrum of positive-bandpass signals 66 and negative-bandpass-frequency signals 68 by a positive-frequency lowpass function 70 and adjust the bottom of the bandpass to zero baseband frequency 72, to yield the desired sampled analytic signal spectrum. Thus, the DHTF network removes the negative frequency components of a real signal, thereby generating an analytic signal which is translated to zero frequency, allowing the complex envelope of the analytic signal to be obtained and the resulting vector signal to be projected onto an orthogonal pair of basis vectors so that the real and imaginary components of the analytic signal can be extracted for subsequent signal processing (e.g. demodulation).

While one presently preferred embodiment of my homodyne down-converter with DHT filtering, for use with a digital discriminator in a FM digital demodulator, has been described in detail herein, many modifications and variations will now become apparent to those skilled in the art. It is my intent, therefore, to be limited only by the scope of the appending claims and not by the specific details and instrumentalities presented herein by way of explanation of one embodiment.

What is claimed is:

1. A homodyne down-converter, for providing substantially simultaneous output streams of in-phase I data and quadrature-phase Q data words to a digital detector means of a digital demodulator receiving an analog IF signal, comprising:
   ADC means for converting the analog IF signal, having a center frequency $f_{IF}$, to a stream of digital data samples taken at a sampling frequency $f_s$ substantially equal to $4f_{IF}$;
   digital mixer means for converting the digital data sample stream to a stream of baseband digital data words;
   means for removing from the data words the effect of any DC offset in the analog IF signal; and
   a discrete Hilbert transform filter (DHTF) means for generating streams of sequential in-phase and quadrature-phase data words, with each stream being used to form one of the down-converter output streams.

2. The down-converter of claim 1, further comprising means for resampling the pair of DHTF means output data streams at a new data rate.

3. The down-converter of claim 2, wherein the removing means comprises: means for summing the data values of each successive pair of a present data word and a next-to-last previous data word; and means for multiplying the summed data values by a factor of one-half.

4. The down-converter of claim 3, wherein the summing means includes means for delaying each of the data words by a time interval equal to the period between two successive data words.

5. The down-converter of claim 4, wherein the multiplying means include means for removing the least-significant-bit of the summed data value word and for shifting the remaining bits rightwardly by one bit position.

6. The down-converter of claim 1, wherein the DHTF means realizes the transfer function $H(z)=(z+j)^n/z^n$, where n is greater than 1; all of the real terms of said transfer function acting upon the in-phase data and all of the imaginary terms of said transfer function acting upon the quadrature-phase data.

7. The down-converter of claim 6, wherein n=2 and said DHTF means comprises: first and second means each for delaying each of a succession of input data words by a time interval substantially equal to the time interval between each pair of data samples; means for summing the data values of the input data word and the data word then at an output of the second delaying means; and means for multiplying the summed data values of a factor of one-half, to provide the in-phase data; an output of the first delaying means providing the quadrature-phase data.

8. The converter of claim 7, wherein the delay of each of said delaying means is established by an integer number of cycles of a clock signal at the sampling frequency.

9. The down-converter of claim 6, wherein n is greater than 2.

10. The converter of claim 6, wherein the data words are arranged in a serially-interleaved stream, of the form I1–Q1–I2–Q2– . . . –$I_i$–$Q_i$– . . . , where i is an integer, and the DHTF means provides an in-phase data word $I_i$ at a first output substantially simultaneously with a quadrature-phase data word Qi provided at a second output.

* * * * *